United States Patent [19]

McCune, Jr.

[11] Patent Number: 5,247,469

[45] Date of Patent: Sep. 21, 1993

[54] DIGITAL FREQUENCY SYNTHESIZER AND METHOD WITH VERNIER INTERPOLATION

[75] Inventor: Earl W. McCune, Jr., Santa Clara, Calif.

[73] Assignee: Proxim, Inc., Mountain View, Calif.

[21] Appl. No.: 705,573

[22] Filed: May 23, 1991

[51] Int. Cl.[5] ............................................. G06F 1/02
[52] U.S. Cl. ......................................................... 364/721
[58] Field of Search ............................ 364/721; 328/14

[56] References Cited

U.S. PATENT DOCUMENTS

| | | | |
|---|---|---|---|
| 4,039,806 | 8/1977 | Fredriksson et al. | 364/721 |
| 4,159,527 | 6/1979 | Yahata et al. | 364/721 |
| 4,192,007 | 3/1980 | Becker | 364/721 |
| 4,348,734 | 9/1982 | Doupherty | 364/721 |
| 5,126,960 | 6/1992 | Thong | 364/721 |

Primary Examiner—Tan V. Mai
Attorney, Agent, or Firm—Burns, Doane, Swecker & Mathis

[57] ABSTRACT

Digital frequency synthesizer and method in which an output signal of desired frequency is synthesized by periodically incrementing a count in steps corresponding to a desired output frequency, monitoring the count to determine when it reaches a level corresponding to a point at which a transition is desired in the output signal, providing a series of waveforms which are displaced in time and have transitions occurring at different times, and selecting the waveform which has a transition closest to the desired point as the output signal.

19 Claims, 2 Drawing Sheets

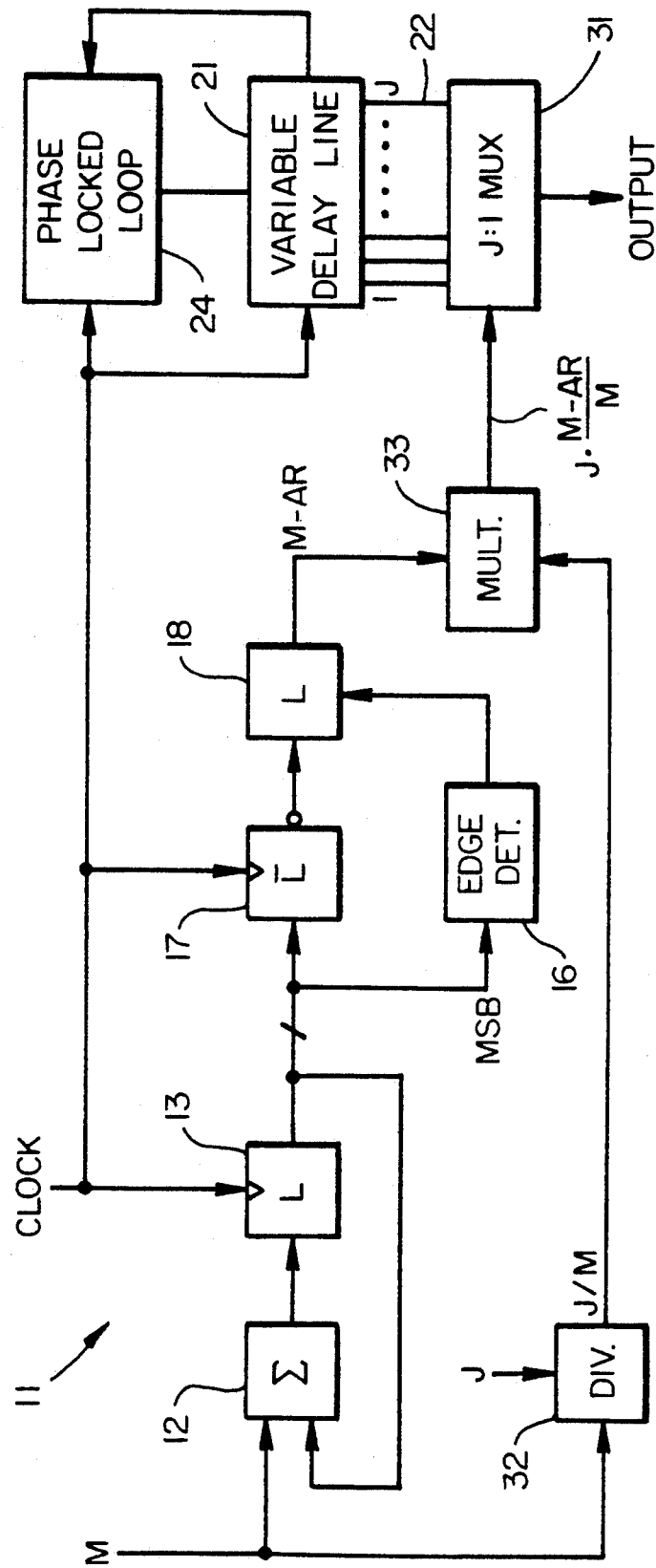
FIG_1

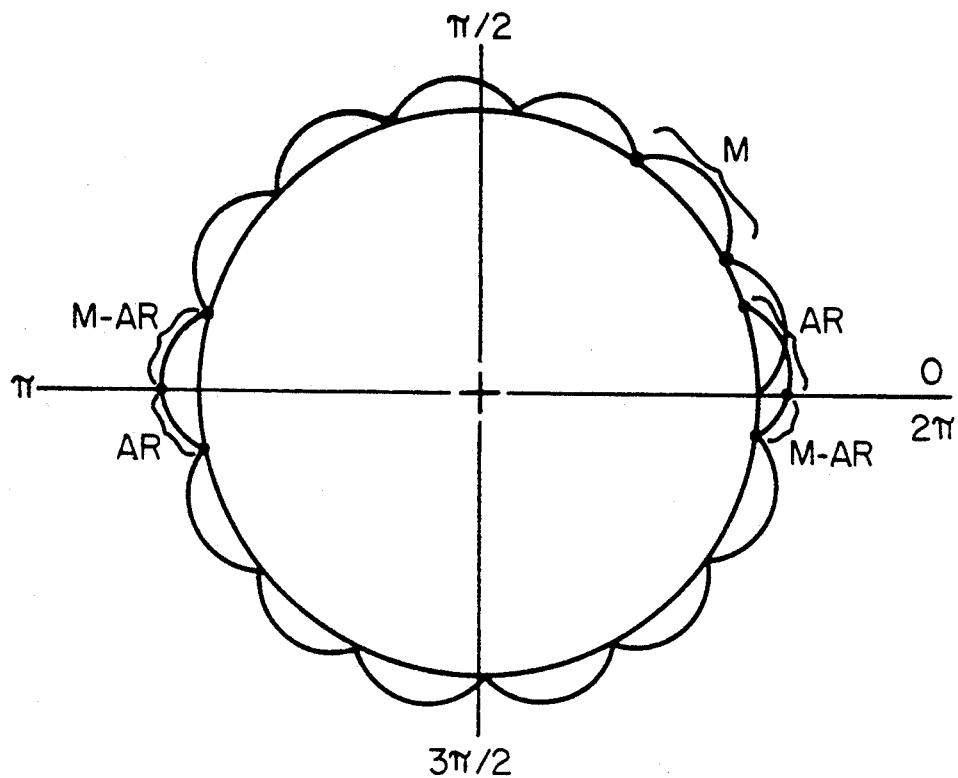
FIG_2
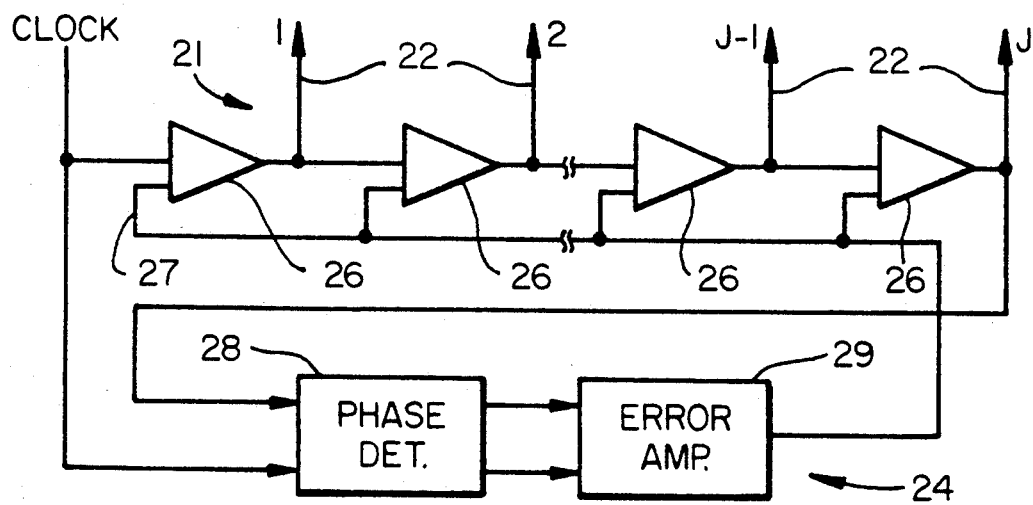
FIG_3

DIGITAL FREQUENCY SYNTHESIZER AND METHOD WITH VERNIER INTERPOLATION

BACKGROUND OF THE INVENTION

1. Field of the Invention

This invention pertains generally to frequency synthesizers and, more particularly, to a digital frequency synthesizer and method utilizing vernier interpolation to provide an output signal of desired frequency.

2. Description of Related Art

Digital frequency synthesizers heretofore provided have employed a high speed waveform memory, a digital-to-analog converter and an analog filter to provide an output signal of desired waveform and frequency. These elements represents a substantial portion (e.g., 80 percent) of both the cost and power consumption of the synthesizer. The output of such synthesizers is in the form of a sinusoidal wave, and bandwidth of the output is limited in practice to only about 40 percent of the clock frequency.

It is in general an object of the invention to provide a new and improved digital frequency synthesizer and method for providing an output signal of desired frequency.

Another object of the invention is to provide a frequency synthesizer and method of the above character which overcome the limitations and disadvantages of synthesizers heretofore provided.

SUMMARY OF THE INVENTION

These and other objects are achieved in accordance with the invention by periodically incrementing a count in steps corresponding to a desired output frequency, monitoring the count to determine when it reaches a level corresponding to a point at which a transition is desired in the output signal, providing a series of waveforms which are displaced in time and have transitions occurring at different times, and selecting the waveform which has a transition closest to the desired point as the output signal.

BRIEF DESCRIPTION OF THE DRAWINGS

FIG. 1 is a block diagram of one embodiment of a digital frequency synthesizer according to the invention.

FIG. 2 is a phase diagram illustrating the operation of the embodiment of FIG. 1.

FIG. 3 is a block diagram of one embodiment of a delay line and a controller for use in the embodiment of FIG. 1.

DETAILED DESCRIPTION

As illustrated in FIG. 1, the synthesizer includes a numeric synthesizer or oscillator in the form of an accumulator 11 having a binary adder 12 and a latch 13. An input signal M which defines the frequency of the output signal from the synthesizer is applied to one input of the adder, and the output of the latch is connected to a second input of the adder. A clock signal is applied to the latch, and each time the latch is clocked, the count in the accumulator is incremented by the value of the input signal M. This relationship is illustrated in FIG. 2. The input signal M is a binary word, and in one present embodiment it is encoded in hexadecimal form. The numeric synthesizer or oscillator can be of any suitable type, including a variable modulus synthesizer of the type disclosed in Ser. No. 310,134, filed Feb. 14, 1989, now U.S. Pat. No. 5,053,982.

In synchronous digital systems, changes in state occur only on the edges of clock pulses, and the frequency of the output signal can be accurately controlled by controlling where the zero crossings or transitions occur in the signal. With a rectangular waveform, for example, zero crossings occur at the beginning and end of each cycle and at the midpoint of the cycle. In the phase diagram of FIG. 2, the capacity of accumulator 11 corresponds to one cycle or period of the output signal, and the zero crossings occur at 0, $\pi$ and $2\pi$ radians. In the embodiment disclosed, the zero crossings which occur at $\pi$ and $2\pi$ radians are utilized to control the output signal. These points occur when the count in the accumulator reaches one-half of the capacity of the accumulator and when the count reaches the accumulator capacity and rollover occurs. Thus, with an accumulator having a capacity of $2^n$, where n is a positive integer, the zero crossings should occur when the count reaches $2^{n-1}$ and $2^n$, respectively.

Since the count in accumulator 11 increases in quantized steps, the points at which the count reaches the half capacity and full capacity levels will not coincide with a step in the count except at those frequencies where the capacity of the accumulator happens to be an even multiple of the product of the clock rate and the frequency of the output signal. For all other frequencies, there will be some overshoot as the count reaches half capacity and full capacity.

With a binary accumulator, the most significant bit in the accumulated count changes when the half capacity and full capacity levels are reached, and the amount of overshoot can be determined from the information contained in the bits of lesser significance. The most significant bit in the output of the accumulator is thus applied to an edge detector 16 which produces an output signal when the level of this bit changes, and the bits of lesser significance are applied to an inverting latch 17. The output of this latch is connected to the input of another latch 18, and the output of edge detector 16 is applied to the clock input of latch 18. The output of latch 18 is a signal having a value M-AR, where M is the frequency of the signal to be synthesized and AR is the remainder in the accumulator after the step in which the half capacity and full capacity levels are reached. The value M-AR thus represents the amount of overshoot which has occurred.

The output signal is generated by applying the generally rectangular clock signal to a delay line 21 which has a plurality of output taps 22. The signals thus produced at the output taps are a series of waveforms similar to the clock signal but displaced from each other in time or phase by an amount corresponding to the delay provided by each individual stage of the delay line. The amount of the delay can be any suitable amount, but the delays of the individual stages are preferably made equal to each other so the zero crossings of successive ones of the output waveforms are separated by equal amounts. The resolution of the system is dependent upon the number of output waveforms and the delay between them, and for greater accuracy a greater number of output lines with smaller delay is preferred. In the drawings, the delay line is illustrated as having J output taps, where J is a positive integer.

The overall delay provided by the delay line is preferably equal to the period of an integral number of cycles of the clock signal, and in one presently preferred embodiment, the delay line provides a total delay equal to the period of one clock cycle. In order to make the overall delay exactly equal to the desired interval, a variable delay line is employed, with a phase locked loop 24 controlling the amount of delay.

In the embodiment illustrated in FIG. 3, the delay line comprises a series of amplifiers 26 with control lines 27 for controlling the propagation times of the amplifiers. The output of the last amplifier in the series is connected to one input of a phase detector 28, and the clock signal is applied to a second input of the same phase detector. The outputs of the phase detector are connected to the inputs of an error amplifier 29, and the output of the error amplifier is connected to the control inputs of the delay amplifiers. The phase detector and the error amplifier thus form a phase locked loop which adjusts the delays of the individual inverters in the delay line to make the overall delay equal to an integral number of clock periods.

The output taps of the delay line are connected to the inputs of a J:1 multiplexer 31, where J is the number of output taps in the delay line. A control signal is applied to the multiplexer to select as the output signal the waveform which has a zero crossing transition closest to the point where the accumulator count reaches half capacity. The control signal is obtained by digitally dividing J by M in a divider 32 and multiplying the quotient by $M-AR$ in a multiplier 33 to provide a signal having a value $J(M-AR)/M$, which corresponds to the exact point in the accumulator count where the desired zero crossing should occur. The delayed waveform selected by this signal is thus the one with a zero crossing closest to the desired point.

Operation and use of the synthesizer, and therein the method of the invention, are as follows. An input signal M which defines the frequency of the output signal to be synthesized is applied to the input of accumulator 11. The count in the accumulator increases by the amount M on each successive clock pulse until it reaches one-half of the capacity of the accumulator and until it reaches the full capacity of the accumulator. These events are detected by a change in the level of the most significant bit in the accumulator, and when these changes occur, the bits of lesser significance are processed to provide a control signal having a value $J(M-AR)/M$ which corresponds to the exact points in the output signal where the desired output signal changes must occur. A series of output waveforms having zero crossings occurring at different times is provided by applying the clock signal to a delay line having a plurality of output taps, and the control signal is used to select the waveforms with zero crossings closest to the half capacity and full capacity points as those required by the output signal.

The zero crossings occur in opposite directions at the half capacity and full capacity points, e.g. a positive-going transition at the half capacity point and a negative-going transition at the full capacity point. Performing the interpolation at both the half capacity point and the full capacity point prevents any asymmetry in the delayed clock signals from being reflected in the output waveform. If desired, transition directions can be reversed.

The invention has a number of important features and advantages. It provides direct digital synthesis of an output signal of desired frequency without either a waveform mapper or a digital to analog converter. It is substantially more economical than digital synthesizers heretofore provided from the standpoints of both cost and power consumption, and it also provides a greater resolution in the output signal. In addition, it also provides a greater bandwidth of output signals with a given clock frequency. Unlike the sinusoidal waveforms which limit the bandwidth of other synthesizers to about 40 percent of the clock frequency, the rectangular waveform produced by the invention imposes no such limitation, and the output bandwidth can exceed the clock frequency.

It is apparent from the foregoing that a new and improved digital frequency synthesizer and method have been provided. While only certain presently preferred embodiments have been described in detail, as will be apparent to those familiar with the art, certain changes and modifications can be made without departing from the scope of the invention as defined by the following claims.

I claim:

1. A system for synthesizing an output signal of desired frequency, comprising: means for periodically incrementing a count in steps corresponding to the desired frequency, means for monitoring the count and providing a control signal when the count reaches a level corresponding to a point at which a transition is desired in the output signal, means for providing a series of waveforms which are displaced from each other in time and have transitions occurring at different points, and means responsive to the control signal for selecting the waveform which has a transition closest to the desired point as the output signal.

2. The system of claim 1 wherein the waveforms have a rectangular shape.

3. The system of claim 1 wherein the means for providing the waveforms comprises a clock which provides a generally rectangular signal, and a delay line to which the generally rectangular signal is applied, the delay having a plurality of output taps at which the displaced waveforms appear.

4. A system for synthesizing an output signal of desired frequency, comprising: an accumulator, means for periodically incrementing a count in the accumulator in steps corresponding to the desired frequency, means for providing a control signal corresponding to a point in one of the steps where the count reaches a predetermined level, means for providing a series of waveforms which are displaced in time and have transitions occurring at different times, and means responsive to the control signal for selecting as an output signal one of the waveforms which has a transition occurring at a time in the interval corresponding to the point in the step where the predetermined level is reached.

5. A system for synthesizing an output signal having a frequency defined by a binary word M, comprising: an accumulator having a capacity of $2^n$ where n is a positive integer, means for periodically incrementing a count in the accumulator in steps of M in response to a clock signal, means for detecting when the count reaches a level of $2^{n-1}$ or $2^n$, means for providing a signal having a value M-AR where AR is the remainder in the accumulator at the end of the step in which the count reaches $2^{n-1}$ or $2^n$, a tapped delay line having J output taps where J is a positive integer, means for applying the clock signal to the delay line to provide a series of J waveforms which are displaced in time from each other at the output taps, means for combining the M-AR signal with signals having values M and J to provide a control signal having a value $J(M-AR)/M$, a multiplexer connected to the output taps of the delay line, and means for applying the control signal to the multiplexer to select one of the waveforms from the delay line as an output signal.

6. The system of claim 5 wherein the waveforms at the output taps of the delay line are displaced over an interval equal to an integral number of periods of the reference signal.

7. The system of claim 5 wherein the means for detecting when the count reaches a level of $2^{n-1}$ or $2^n$ comprises means for detecting a change in the most significant bit of the count.

8. A system for synthesizing an output signal of desired frequency, comprising: an accumulator having a capacity corresponding to the period of the output signal, means for periodically incrementing a binary count in the accumulator by an amount corresponding to the desired frequency, means for monitoring the most significant bit in the count and providing a signal when the count reaches a level corresponding to one-half of the period of the output signal, and means responsive to the signal for monitoring the bits of lesser significance in the count and providing an output signal having a transition which occurs at a time corresponding to the time when the count reaches the level corresponding to one-half of the period of the output signal.

9. A method of synthesizing an output signal of desired frequency, comprising the steps of: periodically incrementing a count in steps corresponding to the desired frequency, monitoring the count to determine when the count reaches a level corresponding to a point at which a transition is desired in the output signal, providing a series of waveforms which are displaced in time and have transitions occurring at different times, and selecting the waveform which has a transition closest to the desired point as the output signal.

10. The method of claim 9 wherein the waveforms have a rectangular shape.

11. The method of claim 9 wherein the waveforms are provided by generating a generally rectangular waveform and applying the generally rectangular waveform to a delay line having a plurality of output taps at which the displaced waveforms appear.

12. A method of synthesizing an output signal of desired frequency, comprising the steps of: periodically incrementing a count in an accumulator in steps corresponding to the desired frequency, providing a control signal corresponding to a point in one of the steps where the count reaches a predetermined level, providing a series of waveforms which are displaced in time and have transitions occurring at different times, and selecting one of the waveforms as an output signal in accordance with the control signal.

13. A method of synthesizing an output signal having a frequency defined by a binary word M utilizing an accumulator having a capacity of $2^n$ where n is a positive integer, comprising the steps of: periodically incrementing a count in the accumulator in steps of M in response to a clock signal,, detecting when the count reaches a level of $2^{n-1}$ or $2^n$, providing a signal having a value M-AR where AR is the remainder in the accumulator at the end of the step in which the count reaches $2^{n-1}$ or $2^n$, applying the clock signal to a tapped delay line having J output taps, where J is a positive integer, to provide a series of J waveforms which are displaced in time from each other at the output taps, combining the M-AR signal with signals having values M and J to provide a control signal having a value $J(M-AR)/M$, applying the waveforms from the delay line to the inputs of a multiplexer, and applying the control signal to the multiplexer to select one of the waveforms as an output signal.

14. The method of claim 13 wherein the waveforms at the output taps of the delay line are displaced over an interval equal to an integral number of periods of the reference signal.

15. The method of claim 13 wherein most significant bit of the count is monitored to detect when the count reaches a level of $2^{n-1}$ or $2^n$.

16. In a method of synthesizing an output signal of desired frequency utilizing an accumulator having a capacity corresponding to the period of the output signal, the steps of: periodically incrementing a binary count in the accumulator by an amount corresponding to the desired frequency, monitoring the most significant bit in the count to identify an increment in which the count reaches a level corresponding to one-half of the period of the output signal, and monitoring the bits of lesser significance in the count to determine where a transition should occur in the output signal to correspond with the time the count reaches the half period level.

17. A system for synthesizing an output signal of desired frequency, comprising: an accumulator having a capacity corresponding to the period of the output signal, means responsive to a clock signal for periodically incrementing a count in the accumulator in steps corresponding to the desired frequency, means for detecting an overflow condition in the accumulator, means for providing a series of waveforms which are displaced in time and have transitions occurring at different points in one period of the clock signal, and means responsive to detection of an overflow condition for selecting one of the waveforms as the output signal.

18. The system of claim 17 wherein the means for detecting an overflow condition includes means for monitoring the most significant bit in the output of the accumulator.

19. The system of claim 18 wherein the means for selecting one of the waveforms includes means responsive to the bits of lesser significance in the output of the accumulator at the time the overflow occurs.

* * * * *